United States Patent
Ellis et al.

(10) Patent No.: US 7,480,774 B2
(45) Date of Patent: *Jan. 20, 2009

(54) METHOD FOR PERFORMING A COMMAND CANCEL FUNCTION IN A DRAM

(75) Inventors: Wayne F. Ellis, Jericho, VT (US); Mark W. Kellogg, Poughkeepsie, NY (US); Daniel J. Phipps, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1292 days.

This patent is subject to a terminal disclaimer.

(21) Appl. No.: 10/249,331

(22) Filed: Apr. 1, 2003

(65) Prior Publication Data
US 2004/0199715 A1 Oct. 7, 2004

(51) Int. Cl.
G06F 12/00 (2006.01)
(52) U.S. Cl. .................. 711/154; 714/763; 714/768; 714/764; 714/8; 714/754; 711/105
(58) Field of Classification Search .................. 711/105
See application file for complete search history.

(56) References Cited

U.S. PATENT DOCUMENTS

| | | | |
|---|---|---|---|
| 4,926,426 A | 5/1990 | Scheuneman et al. | 371/40.1 |
| 5,091,889 A | 2/1992 | Hamano et al. | 365/233.5 |
| 5,347,648 A | 9/1994 | Stamm et al. | 395/575 |
| 5,414,840 A | 5/1995 | Rengarajan et al. | 395/600 |
| 5,555,250 A | 9/1996 | Walker et al. | 371/40.1 |
| 5,603,010 A * | 2/1997 | Dodd et al. | 711/167 |
| 5,815,463 A | 9/1998 | Shih et al. | 365/233 |
| 5,974,514 A | 10/1999 | Andrewartha et al. | 711/166 |
| 5,996,107 A * | 11/1999 | Tomisawa | 714/766 |
| 5,999,481 A | 12/1999 | Cowles et al. | 365/233 |
| 6,052,818 A | 4/2000 | Dell et al. | 714/773 |
| 6,065,146 A * | 5/2000 | Bosshart | 714/754 |

(Continued)

FOREIGN PATENT DOCUMENTS

JP 11272488 A 10/1999

(Continued)

OTHER PUBLICATIONS

Miyatake et al., "Double Data Write in Self-Precharged Single Clock DRAM", IBM Technical Disclosure Bulletin, vol. 39, No. 7, Jul. 1996, pp. 29-31.

Primary Examiner—Matthew D. Anderson
Assistant Examiner—Jonathan Barton
(74) Attorney, Agent, or Firm—Michael J. LeStrange

(57) ABSTRACT

A method for performing a common cancel (CC) function on a dynamic random access memory (DRAM) semiconductor device to improve reliability and speed of a memory system. The CC function rakes advantage of the intrinsic delays associated wit memory read operations at high clock frequencies, and the increased write latency commensurate with increased read latencies where non-zero larencies for read and write operations are the norm by permitting address and command ECC structures to operate in parallel with the address and command re-drive circuitt The CC function is extendable to future DDR2 and DDR3 operating requirements in which latency of higher frequency modes will increase due to the shift from 2 bit pre-fetch to 4 and 8 bit pre-fetch architecture.

11 Claims, 6 Drawing Sheets

U.S. PATENT DOCUMENTS

| | | | |
|---|---|---|---|
| 6,108,753 A | 8/2000 | Bossen et al. | 711/118 |
| 6,130,856 A * | 10/2000 | McLaury | 365/233 |
| 6,236,619 B1 | 5/2001 | Cho et al. | 365/233 |
| 6,272,608 B1 | 8/2001 | Ryan et al. | 711/167 |
| 6,279,134 B1 | 8/2001 | Yamamoto et al. | 714/763 |
| 6,321,296 B1 | 11/2001 | Pescatore | 711/118 |
| 6,681,301 B1 * | 1/2004 | Mehta et al. | 711/154 |
| 6,707,756 B2 * | 3/2004 | Amidi | 365/233 |
| 6,826,113 B2 * | 11/2004 | Ellis et al. | 365/233 |

FOREIGN PATENT DOCUMENTS

JP   2001250379 A   9/2001

* cited by examiner

METHOD FOR PERFORMING A COMMAND CANCEL FUNCTION IN A DRAM

BACKGROUND OF THE INVENTION

The present invention relates generally to integrated circuit memory devices and, more particularly, to a synchronous dynamic random access memory (SDRAM) system.

Problems in state of the art memory systems have been because of intrinsic delays associated with memory read operations at high clock frequencies, and the increased write latency commensurate with increased read latencies, where non-zero latencies for read and write operations are the norm. In the case of 'read' operations, this data latency will be directly associated with the amount of time required to access the data from the sense amplifier latch or other intermediate storage location—typically 3 or 4 clocks at a 266 MHz clock speed. In the case of 'write' operations, whereas it is still theoretically possible to provide data and address at the same time, data will typically be delayed several clocks after address, to improve command/address bus efficiency and reduce SDRAM power—since read and write operations will generally be intermixed in the system command stream.

Due to the use of various forms of error correction code (ECC) now widely used on the data bus in server and workstations, most memory failures now result from causes other than traditional data corruption (soft and hard fails of the memory cell or supporting circuits). With the increased dependency on data storage in remote systems (databases, workrooms, department and company servers, and the internet in general), memory failures in server platforms are undergoing increased scrutiny in an attempt to minimize the time in which data or the entire system is unavailable due to hardware failures. Analysis of recent memory failure reports clearly points to the key contributors of memory-induced unplanned system outages as being related primarily to address, control, clock or related signals that do not include ECC coverage, and due to one or more of the following failure modes: connector/contact failures, memory controller or re-drive failures, high resistance solder joints, or the like. Since these signals are quite numerous, often passing through several levels of interconnects, and due to the general use of low-cost connectors, the interconnect systems are generally deemed as a significant contributor of memory failures in a well-architected ECC-protected system (representing 50% or more of total hard memory fails).

SUMMARY OF THE INVENTION

It is an object of the present invention to improve the overall memory system reliability without incurring additional latency.

Another object is to improve the detectability and correction of failures associated with interconnects.

One solution to improve the detectability and correction of failures associated with interconnects is to include error correction across all memory command and address signals, and correct any identified errors during valid operations to a given memory assembly. This approach can be very cost-effective, in that most high-reliability applications now utilize memory assemblies (modules) which include local command and address re-drive circuitry on the same carrier as the synchronous DRAM memory devices. To implement ECC across the command and address lines requires only that few additional pins be added to the drivers, connectors and module re-drive circuits—in conjunction with the ECC logic. Unfortunately, this method also increases the memory access time, as the ECC logic will result in one to two clocks of added command and address latency (depending on the clock period and logic circuit delays). Since memory failures of this type are generally rare, and due to the system emphasis on minimizing access delays during cache misses, simple use of ECC, as described, is not an ideal solution in many applications.

The present invention couples the addition of a new SDRAM operation, ideally suited for emerging devices with non-zero write data latency, with command and address ECC implemented in parallel with the normal memory re-drive method (to ensure minimum memory read and write latency). In summary, the key attributes of this invention are as follows:

1) ECC logic is added to the memory control and address paths, with the intention that single or even multiple bit failures, during valid command cycles, can be corrected to prevent a system outage. It is expected that most will implement this ECC function external to the synchronous memory devices, although the memory devices could include this function as well.

2) Memory commands and addresses are passed to the memory devices, with minimal insertion delay, as the ECC logic function occurs in a parallel path. Should an error be identified by this logic, the ECC correction circuitry will enable rapid recovery without permitting data corruption in the memory.

3) In systems produced using memory devices with the new 'cancel' command:

Any 'read' or 'write' operations that are initiated using command and address inputs subsequently found to be valid, will be executed normally, and without added delay or interruption.

Any 'read' operations initiated using command and address inputs subsequently found to be invalid, will generally have the 'read' data discarded, and the device returned to an idle state awaiting error recovery. For completeness, the present invention includes the concept of early termination of a 'read' operation, since longer bursts are expected in future devices, and a performance savings is possible when recovering from an error.

Any 'write' operations initiated using command and address inputs subsequently found to be invalid, would be followed by a 'Command Cancel (CC)' command, to the same memory bank(s), to prevent the data stored by the memory device(s) from being over-written erroneously. The command would generally return the device to a 'standby' state, awaiting error recovery—although other return states are possible, and would be covered by this invention.

In an ideal system implementation, the memory would be designed to permit continuous operation in a traditional ECC mode (in series with the command and address) or in parallel mode—to ensure minimum latency.

4) System response to a memory command or address ECC error could include one or more of the following actions:

Re-try of failing operation while the ECC is operating in parallel mode, depending on the type of error identified. Some failures are intermittent in nature, and a repeat of the failure may be ideal to confirm the cause and/or determine the need for further action. This re-try would be completed with no change to ECC operating in parallel mode such as a "soft error."

Execution of the cancelled operation with ECC being invoked in a serial mode which will add one or two clocks of latency. The memory controller or system re-drive logic would execute a new operation, correct single bit (or greater) errors depending on the ECC algorithm utilized and ensure valid operation.

The system would continue to operate with serial ECC enabled until a repair action occurred, or return to parallel ECC operation pending a repeated failure identification and recovery.

Various levels of reliability improvement can be implemented using this new command, depending on the amount of fault prevention desired when parallel command/address parity or ECC is invoked with the 'command cancel' function.

Some examples include:

To minimize the probability of issuing an illegal command that may result in significant recovery time, any critical signal(s) can include two separate contacts through each interconnect in the signal path—thereby adding contact redundancy to minimize failure due to discrete high resistance contact failures.

Low cost systems might invoke only parity checking on these signals, with the Command Cancel (CC) function utilized only to identify and terminate operations prior to data corruption. Normal operation would terminate to the affected memory and a recovery mode could be implemented such as, multiple re-tries.

To reduce recovery time and/or to simplify controller logic, the 'command cancel' operation can be included in both 'read' and 'write' operations. This is viable only if the DRAM implementation of this function includes both modes.

DESCRIPTION OF THE DRAWINGS

The above objects and advantages of the present invention will become more apparent by describing in detail preferred embodiments thereof with reference to the attached drawing in which.

DESCRIPTION OF THE PREFERRED EMBODIMENTS

A DRAM implementation of the 'command cancel' operation mentioned above can be implemented via a command decode, or via one or more unique pins (to maximize coverage of command bus failures). It should be understood that this is not the only technique that is appropriate—since memory interfaces are periodically re-defined.

Figure 1:
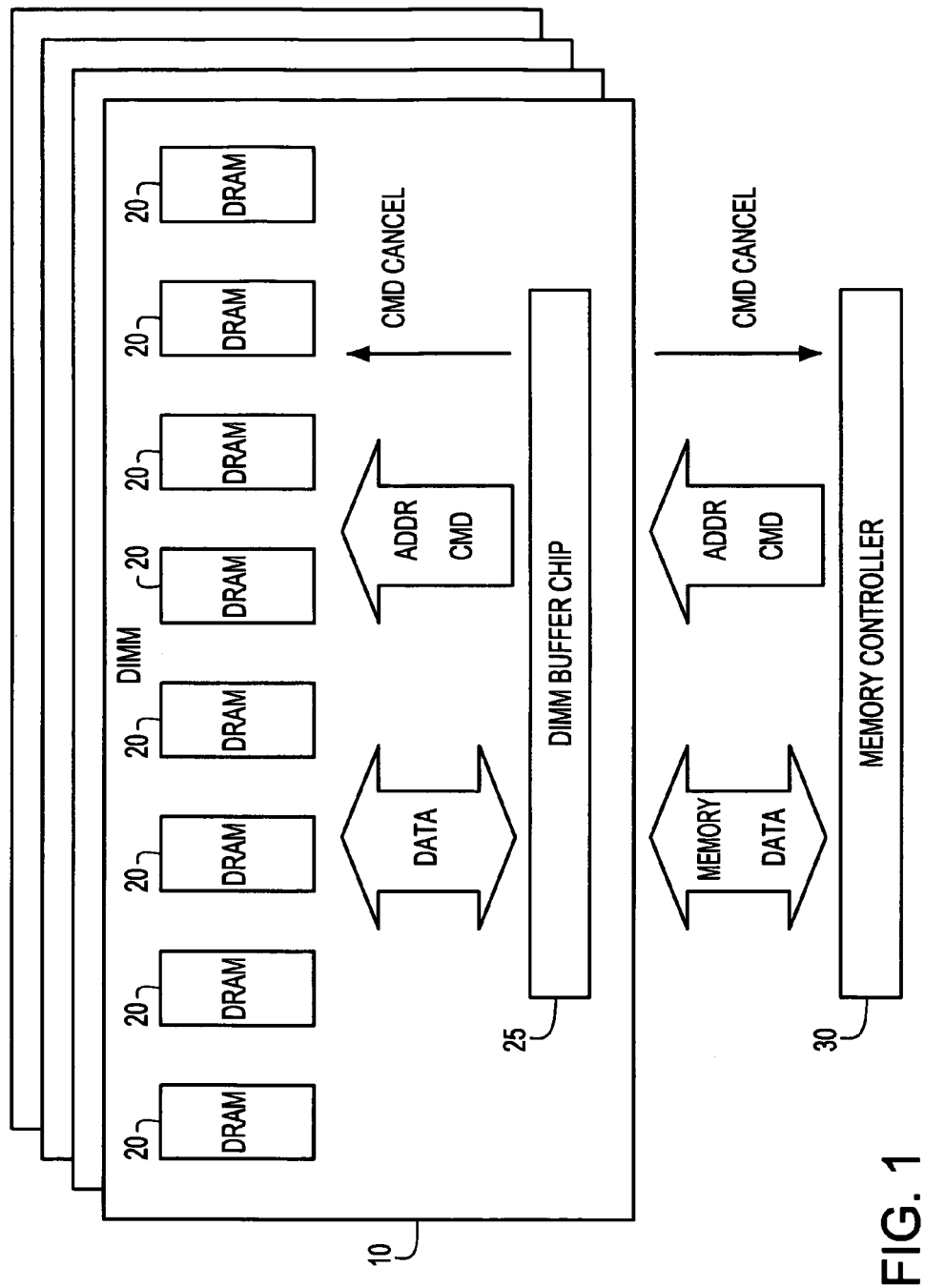
FIG. 1 is a block diagram of the arrangement of present invention on a DIMM.

In summary, the operation of the present invention operates a novel Command Cancel (CC) system in both the read and write operations as follows:

Attention is directed to FIG. 1 which illustrates number of memory modules 10 known as dual in-line memory modules (DIMMS) on which number of Dynamic Random Access Memory 20 (DRAM) and a buffer chip 25 are mounted in a known manner.

The buffer chip receives address commands from an external memory controller or chip 30 and transmits the commands to the DRAMs 20. The memory data is likewise transmitted and received from the memory controller 30 to the buffer chip 25 to and from the DRAMs 20. It should be noted that the memory data may be wired directly from chip 30 to DRAMs 20, rather than passing through buffer chip 25.

The Command Cancel (CC) function would be implemented as shown in FIG. 1 on a DIMM buffer chip 25 via use of ECC logic connected to the Address and/or Command re-drive circuits not shown. The buffer chip could then have two Command Cancel output buffers; one coupled to the on-DIMM DRAM chips and another to drive back to the Memory Controller chip. Although this has been described, the Command Cancel function to the DRAMs as being implemented via one or more unique wires, it is well known in the art that other methods of communication, such as, a command decode could be placed on the existing buffer interface.

Figure 2:
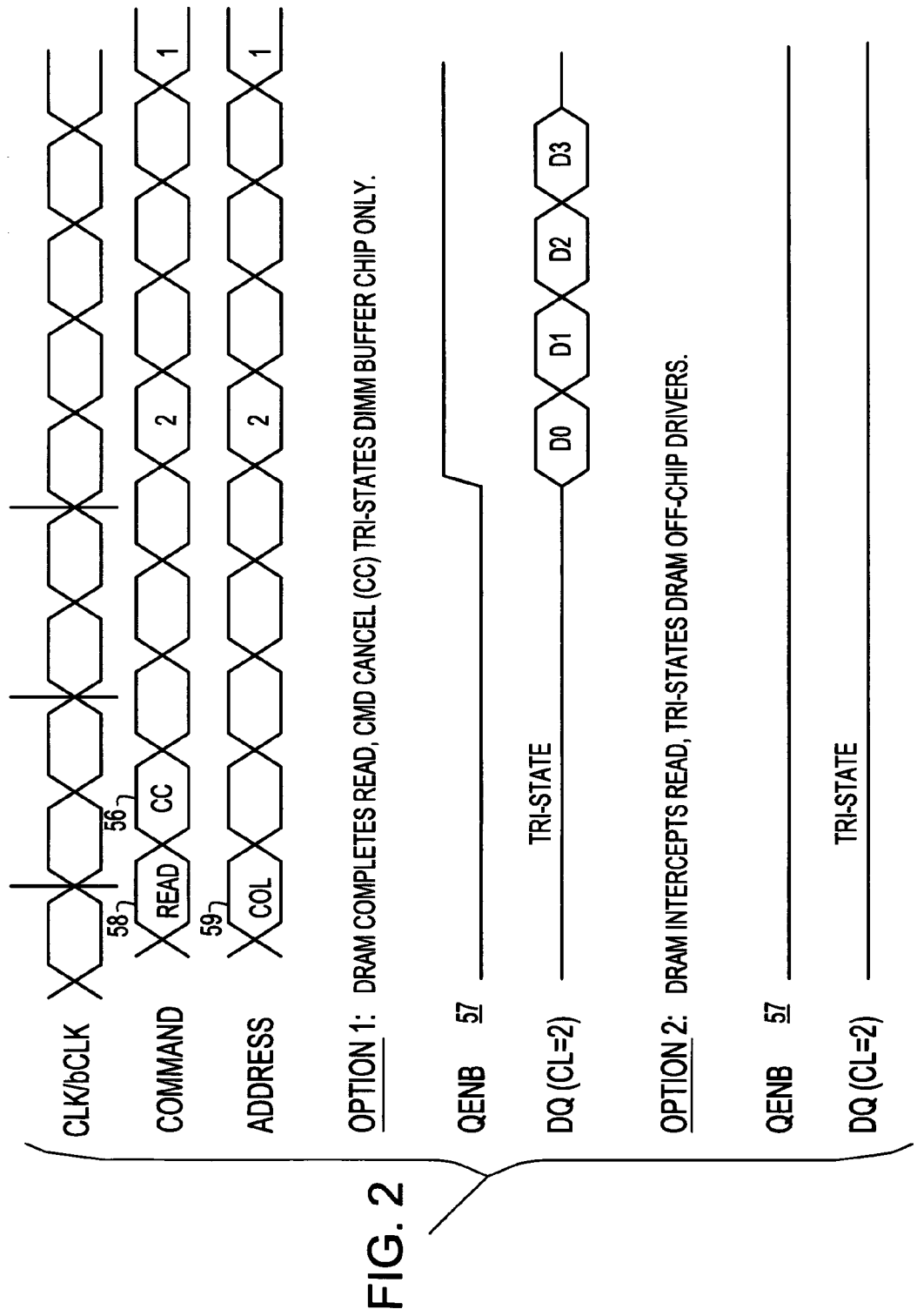
FIG. 2 is timing diagrams illustrating the waveforms for the DRAM for a read operation with two options for Command Cancel (CC) operation.

Implementation of the Command Cancel function on the DRAM chip takes advantage of the natural latch boundaries in a DDR synchronous DRAM. These latch boundaries, with the latencies of the Read or Write operation in the chip, provide for the interception and disabling of an undesired Read/Write command. In the case of the Write operation, it is critical that it is disabled before data in the DRAM array can be corrupted, by an unintended operation or some other problem Read Operation As shown in FIG. 2, in a Read operation, the Command Cancel could allow the DRAM to complete the Read data burst, but tri-state the memory bus I/O drivers on the DIMM Buffer Chip thereby allowing for other uses of this interface at this time. Another option would be for the DRAM to respond to the Command Cancel input by tri-stating the DRAM off-chip drivers and resetting the internal DRAM circuits, saving both power and latency prior to recovery of normal operation.

The input/output waveforms shown in FIG. 2, on a DRAM chip, are for a Read operation that is to be cancelled. This example illustrates a chip operating with a Burst Length (BL)=4 and a CAS Latency (CL)=2. The DDR chip receives two clock inputs (CLK and bCLK) which may be a differential clock pair. Commands and Addresses are latched at the clock transition when CLK is rising. In this example, a Read Command and its associated Column Address are followed at the next rising edge of CLK by a Command Cancel operation.

Under Option 1, the DRAM does not respond to the Command Cancel signal CC. In this case, the Read data is bursted from the DRAM. The DIMM Buffer Chip however responds to the CC by keeping its buffers in tri-state so that the Read data is not driven off the DIMM onto the Memory Data bus. In this option, the data drivers on the DRAMs remain active until the data burst is completed (1), resulting in extra power consumption and possible loss of system performance due to the 2 cycle wait period related to the data bus, after the initial CC is issued.

Under option 2, the DRAM does respond to the CC, with the internal QENB signal remaining low and inhibiting DRAM driver activation.

Figure 3:
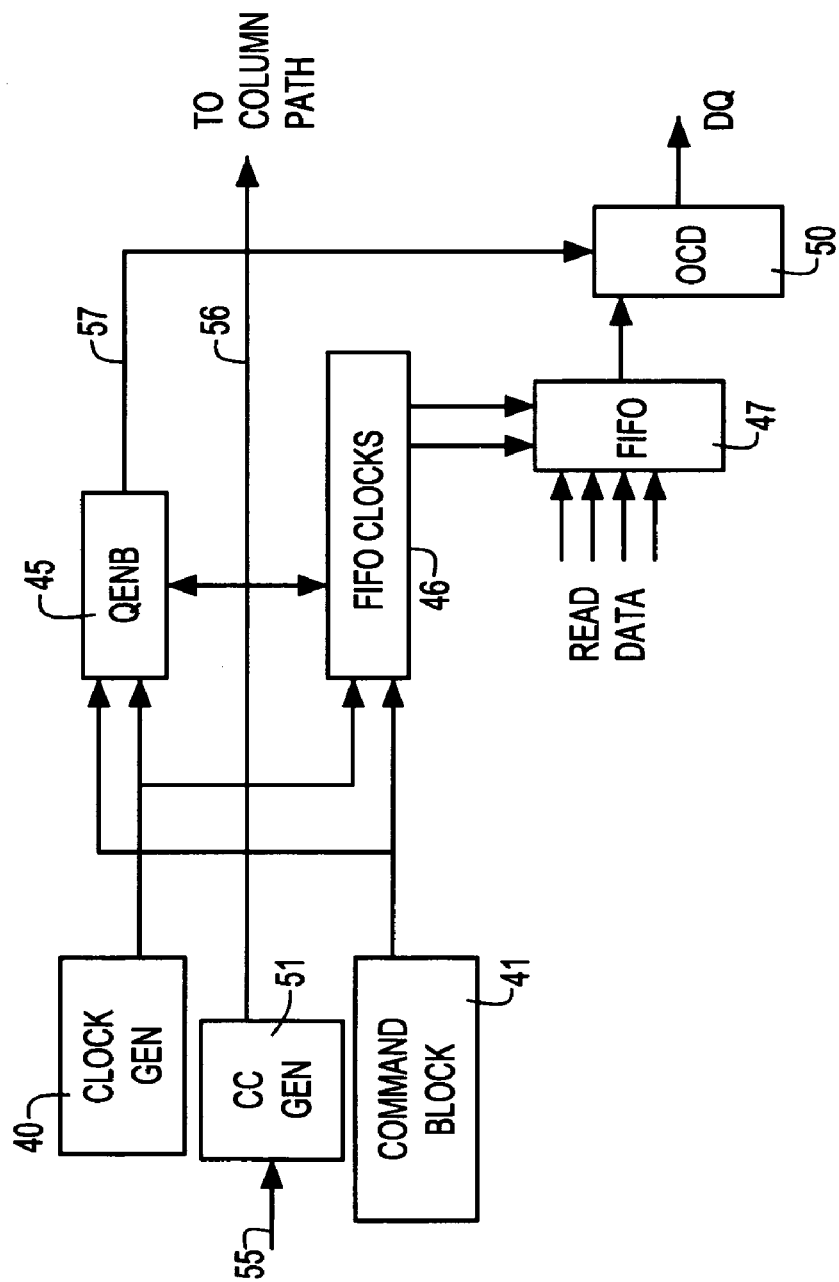
FIG. 3 is a block diagram of a read path in accordance with the present invention.

As illustrated in FIG. 3, for the read path a clock generator 40 and a command block 41 transmits signals to a data enable circuit block (QENB) 45 and FIFO clocks The FIFO clocks 46 transmit control signals to the First In First Out (FIFO) logic 47. The FIFO logic 47 shift registers catch data fetched from the array and hold it to be sent to the OCD. The proper sequencing of the data latched from the array and sent to the OCD is controlled by the FIFO Clocks. The QENB 45 transmits an enable signal to the off chip driver (OCD) 50 which is coupled to a Data Out pad (DQ) for normal Read operation of DRAM. If the OCD is desired to be in bidirectional Tri-State (the OCD in devices OFF), the QENB output would be held in the inverse binary state as that which would enable the OCD. The Command Cancel (CC) generator (CCGEN) 51 sends control signals to QENB 45, FIFO clocks 46 and to the column path to reset the system if required. By contrast, during a Write Command, the QENB output state continuously keeps the OCD's in a Tri-state (high impedance condition).

Accordingly in Option 2, the DRAM internal logic in the Read path shown in FIG. 3 responds to the CC input by creating a On-DRAM CC signal from the CC generator. The CC signal will cancel the activation of the QENB signal. This keeps the DRAM off-chip drivers (OCD) in tri-state. The CC signal would also turn off and reset the FIFO clocks, thus ignoring any Read data that may become available on the internal DRAM data bus. This then provides for the data path to be reset and prepared for accepting the correct data after the subsequent corrected command or address is issued. The CC signal also propagates to the Column path where it will be used to reset the various latches and decoders which couple data read from the array to the Read path.

In this option, a new corrected command and address can be issued prior to when the data burst would have completed (2), saving power consumption and improving system recovery performance due to the 4 vs. 8 cycle wait period after the initial CC is issued.

Figure 4:
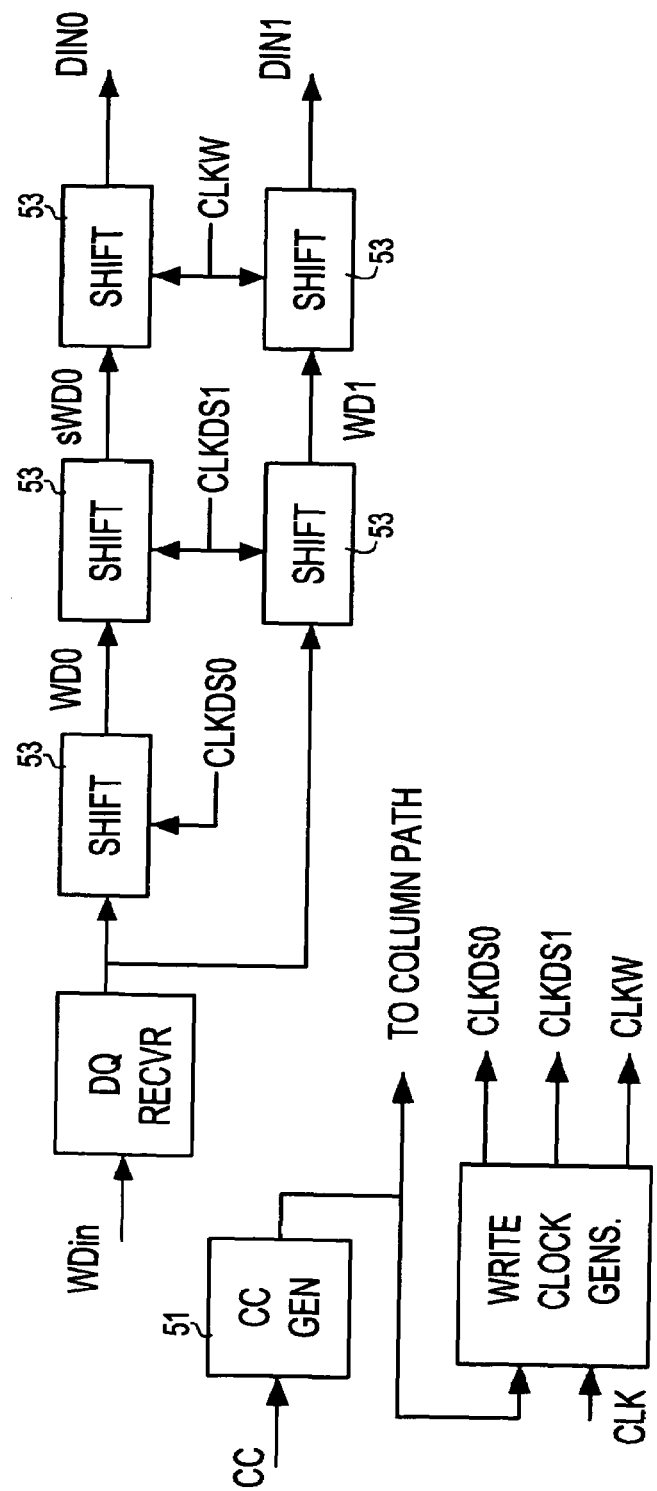
FIG. 4 is a block diagram of a write path in accordance with the present invention.

In FIG. 4 is shown the Command Cancel generator, (CC Gen) 51 which will either by a discrete input pin or by an output of the on-chip Command Decoder, assert the CC signal. The CC signal will cancel the serial to parallel conversion of write input data in the Data In shift register circuits (Shift) 53 by disabling and resetting the double data rate (DDR) input shift register Clocks (CLKDS0, CLKDS1, CLKW). In read operation, this FIFO system requires one clock for each shift register which is required for an OCD. Accordingly, if there are four (4) FIFO registers required for the OCD, then there are four (4) FIFO clocks required to gate the proper FIFO data to the OCD. The reason for this is that data is fetched from the array in 2 bit or 4 bit chunks. The FIFO clocks need to decode the starting burst address so that the FIFO's data are sent to the OCD in the correct sequence. Without the FIFO clocks and their correlating the captured array data with the clock and the starting address, the data from the OCD would have no way to be in the proper correlation to the intended address. In a write cycle, this insures that the input data is not asserted to Data Lines (DIN0, DIN1) and holds off the assertion of further commands generated by the normal cycling of the DDR shift register clocks. The CC signal will also propagate to reset the Secondary Sense Amp control circuits, the burst counter and the Address Path counters, latches and clocks.

The Command Cancel (CC) thus protects the corruption of the data in the DRAM array by an erroneous write command and/or address. To accomplish this in a standard double data rate DDR component with 2 bit pre-fetch would require that the Command Cancel (CC) be issued in time for the NEXT rising clock edge, so as to be latched by the DRAM chip and propagated to the DRAM Write Path.

This is due to the architecture of a double date rate (DDR) DRAM that allows high frequency operation of the chip while maintaining sufficient time to write data into the DRAM array storage cell. This is accomplished in the Write Path by a Serial to Parallel conversion of the incoming data. Thus in two clock cycles, the two serial input bits are converted to two parallel bits and sent to the array. The array now has two clock cycles to write the data while the next two bits in the Write data stream are undergoing their Serial to Parallel conversion.

Figure 5:
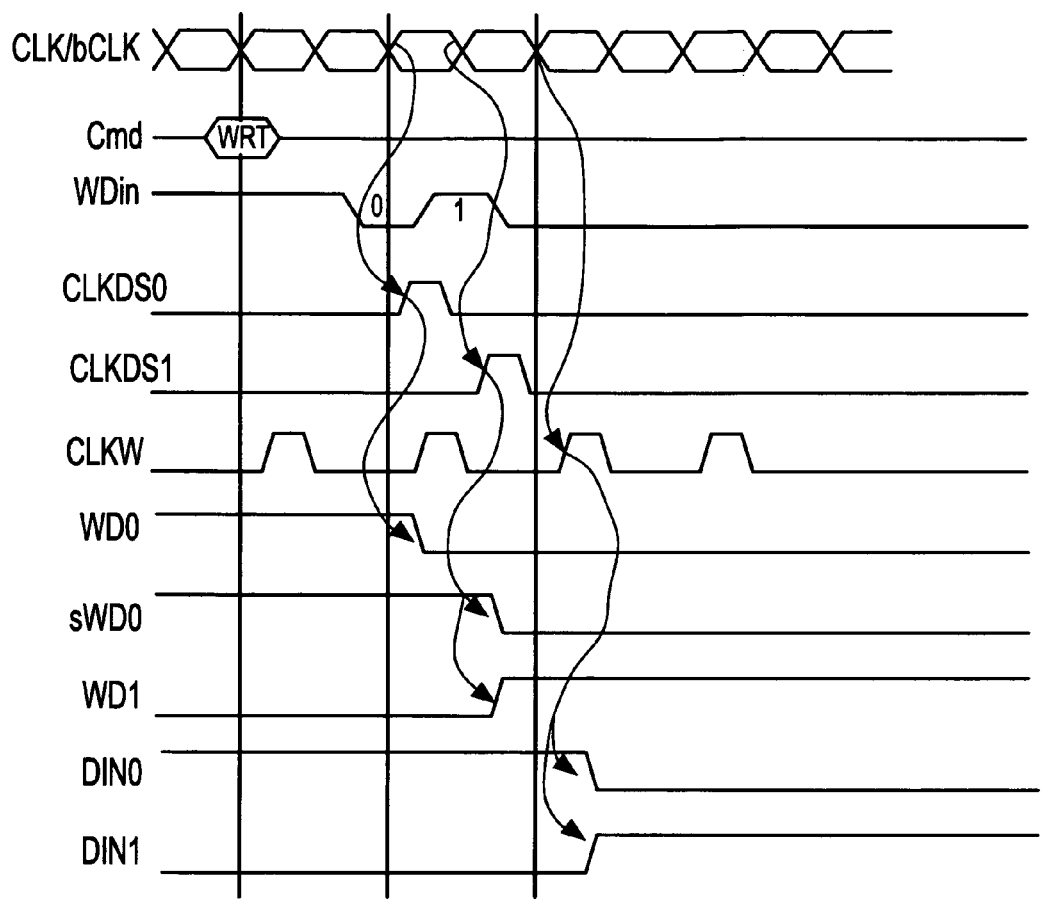
FIG. 5 is a timing diagram of normal write timings.

FIG. 5 shows the voltage waveforms for the DDR write path schematic shown in FIG. 4, for normal operation. An external Write command (WRT) is asserted in phase with the external clock, rising edge (CLK). In this case, one clock later, the input data is asserted to the chip inputs. The shift register circuits, under the control of the DDR shift register clocks (CLKDS0, CLKDS1, CLKW) then transfer the serial data bits (WDin0, 1) onto the parallel internal data lines DIN0, DIN1, as shown by the propagation of the input data thru the internal nodes (WD0, sWD0, WD1). As now can be realized the Write command is latched on the rising edge of CLK, which enables the Write Clock Generators, which provide the shift register clocks (CLKDS0, CLKDS1) and the Write clock (CLKW), shown in FIG. 4. The first Data In bit (WDin) is presented at the next rising clock edge after the assertion of the Write command and the second Data In bit is presented at the falling clock edge. These Data In bits (0 and 1) are latched and shifted by the Write clocks. In this manner the bits are converted from serial to parallel as shown in FIGS. 4 and 5 and sent to the array as DIN0 and DIN1 to be written to the selected DRAM array storage cells.

Figure 6:
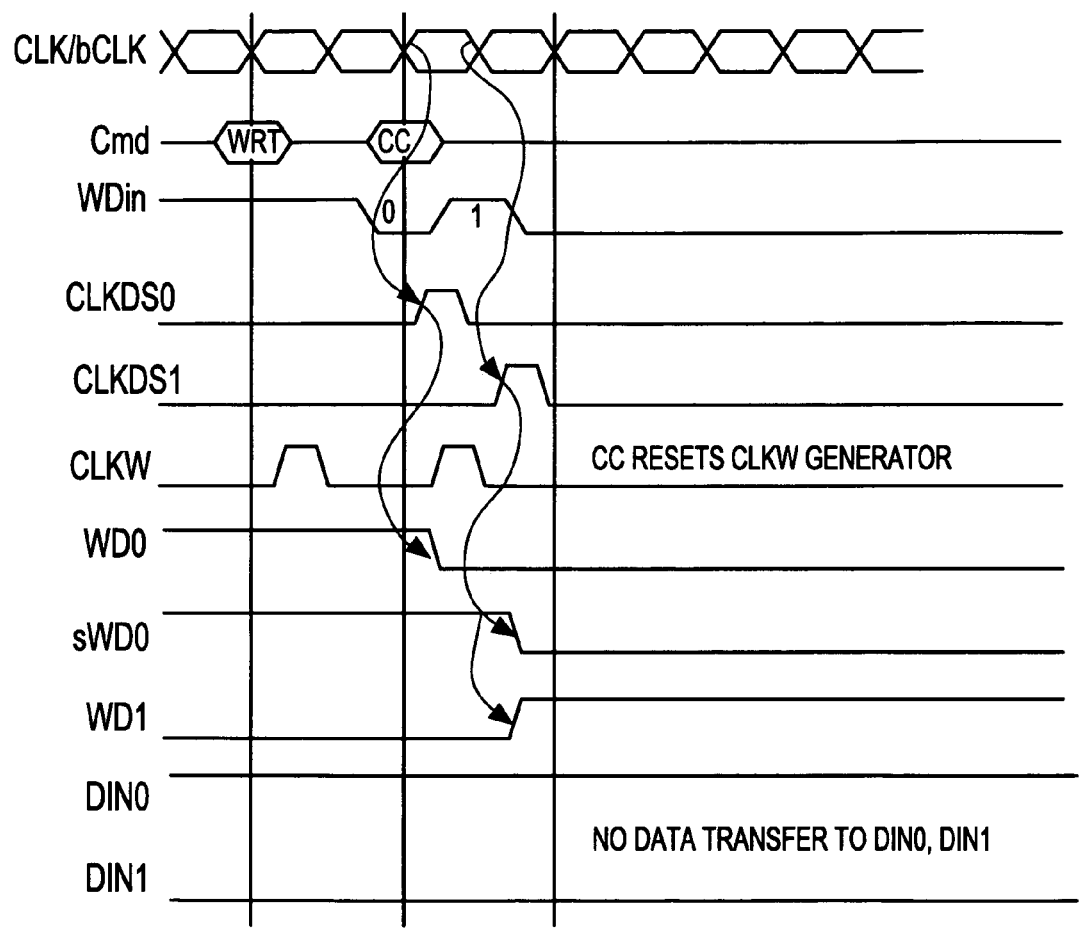
FIG. 6 is a timing diagram of the write timings in accordance with the present invention.

In FIG. 6 is shown the effect of the Command Cancel (CC) on the DDR data in the path. The Write command is again issued with the external clock. In this case, a Command Cancel (CC) is sent on the next full clock cycle later. The diagrams show that the CLKW is the important clock to be intercepted, so as shown, the CC disables and resets the DDR shift Clocks generator, and the input data is never transferred to the DIN0 and DIN1 lines. At the same time, the propagated CC would be resetting latches and clocks in the Secondary Sense Amp control circuits. Thus the CC operation in the Write path protects the array from corrupting data and also minimizes excessive extraneous currents for unneeded and unwanted data line and signal activation. This also contributes to reducing the latency for when the chip can accept a corrected command.

Here the Command Cancel (CC) would be asserted at the next rising clock edge after the initial erroneous Write Command is received. The Command Cancel (CC) will be buffered by the Command Cancel (CC) receiver and sent to the Write Clocks Generator. The CC would then reset the CLKW generator such that the CLKW would not provide the pulse to transfer the shifted data input bits onto the Data In wires DIN0, DIN1 with sufficient time to stop and reset. The waveforms are illustrated in FIG. 6. The buffered on-chip CC command would also propagate to the Column path where it would reset the decode of the column to which the erroneous data bits were destined.

The Command Cancel (CC) concept is extendable to future DDR2 and DDR3 operating requirements in that the latency of these higher frequency modes will increase due to the scaling from 2 bit pre-fetch data path architectures to 4 and 8 bit pre-fetch. This results in 4 or 8 bit shifters in the Write path to provide the serial to parallel conversion that is shown in FIGS. 4, 5, 6 for 2 bit pre-fetch. Therefore, future DDR proposals will still be able to incorporate a Command Cancel (CC) function similar to what is proposed above.

In a Read Operation the system could operate in either of two methods:

Method 1.) The Command Cancel (CC) function would be handled by the controller chip. In this scenario, the DRAM would not be interrupted. The DRAM would read out the data and the bits would be masked at the controller chip, thereby protecting the data stream to the processor. In this method, no extra circuits or signals are required for the Read path circuits.

Method 2.) The impact to system performance for a Command Cancel (CC) during a Read operation could be reduced, especially for longer Burst Length applications (BL=8) by an alternate method. In this case, the Command Cancel (CC) would be sent to the DRAM. This command would be latched, buffered on-chip and affect the following circuits;

Command Cancel (CC) would disable the Output Enable, tri-stating the DQ driver.

Command Cancel (CC) resets Burst Counter to 0.

Reset FIFO clocks.

Reset Column Command and Address Path latches, clocks.

Column Path will then function as if previous command has completed normally and take the "Ready" state which will leave the chip in an Active Standby (Array activated, awaiting a new Column Command). The DRAM control, address and clocking logic is ready for a new corrected Column Command/address.

Could save 4–6 clock edges of bus capacity to restart corrected command.

Write Operation:

An erroneous Write operation to the DRAM is more problematic in that incorrect data or addresses presented to the DRAM can corrupt the data stored in the DRAM array. Therefore, for Writes, the Command Cancel (CC) must intercept and disable an erroneous Write operation. In the example above, where Write latency is greater than zero, the chip would receive a Write command and addresses, followed as many as 3 or 4 clocks later (DDR II and beyond) by the Write Data presented at the chip data inputs. If at this time the chip received a Command Cancel, or even <2 clocks (4 clock edges for DDR2) after assertion of the Write data (assuming a 4 bit pre-fetch chip architecture), this Command Cancel (CC) would be latched, buffered on-chip and affect the following circuits:

Command Cancel would disable the Secondary Sense Amp control circuits (located in COLQSEG in an 512 Mb DRAM chip design).

This command has to be asserted, decoded and propagated to these circuits in time to insure that the MDQ's Write buffers are not activated. For a 4 bit pre-fetch architecture, it takes 4 clock edges to shift in the data for series to parallel input-data conversion. The Command Cancel has to be asserted such that the COLQSEG logic can be deactivated before the 4th clock edge after the applied data.

Command Cancel signal (CC) resets Burst Counter to 0.

Reset DDR input shift registers clocks see FIGS. 4, 5 and 6.

Reset Column Command and Address Path latches, clocks.

Column Path will then function as if previous command has completed normally and take the "Ready" state.

Leave chip in Active Standby (Array activated, awaiting a new Column Command) The DRAM control, address and clocking logic is ready for a new corrected Column Command/address.

Could save bus capacity to restart corrected command.

It should now be understood that due to today's high performance (DDR2) DRAM architectures and circuit technologies, a Command Cancel (CC) function, if applied at least (n−1) clock edges after receipt of a Command (where n=the latency, in clocks, of the read or write operation), could disable the previous command/address/data and reset the internal DRAM circuits—leaving the DRAM in an active ready state to accept a corrected input vector. In a similar fashion to that described above, this function could be extended to Row Command cancellation. In this case, the command would be intercepted and disabled prior to array activation. Thus the array would remain in Standby and ready to accept the corrected input vector.

As described above, the invention offers improved memory subsystem performance by negating the added latency penalty that would normally be incurred through the use of ECC in the memory command and/or address path. Since command/address signal failures are very rare, and since both read and write operations now include non-zero data latency, the addition of this new command to the memory device will permit ECC to be operated in parallel or in series with the normal access path.

Parity and/or ECC has never utilized implementations that included the ability to terminate a read or write operation, to a memory device, subsequent to that command being issued. This new method will permit systems to implement parity or ECC across the command/address bus, operate this feature in parallel to the critical access path, and to subsequently terminate any command later found to be corrupt—prior to data being read or written. This invention could not be implemented without the combination of non-zero device read/write latency, the new 'command cancel' command, and the use of parallel fault detection/correction—hence this disclosure covers both the memory device and the memory subsystem.

Although the invention has been particularly shown and described with reference to a preferred embodiment, it will be understood by those skilled in the art that various changes in form and detail may be made therein without department from the spirit and scope of the invention.

What is claimed is:

1. A method for canceling a read or write operation in a memory system having a plurality of dynamic random access memory (DRAM) devices comprising:

providing address and control information to the plurality of DRAM devices operation through a memory controller to enable a data stream to or from a processor;

masking data by the memory controller, thereby protecting the data stream during read operations if a command cancel signal is received;

generating a command cancel signal to disable the memory system if an incorrect data stream is presented to the DRAM, said command cancel signal being generated within a clocking cycle of the memory system; and restoring the system in response to the command cancel signal.

2. The method of claim 1 which includes:

monitoring the integrity of read or write operations to a DRAM, and generating a command cancel signal in response to the detection of an incorrect operation.

3. A method for canceling a write or read operation in a memory system having a plurality of DRAM devices comprising:

timing the operations in clock cycles;

providing a write latency of one or more clock cycles between receipt of a write command and receipt of data; and generating a command cancel signal to disable the write operation at the DRAM subsequent to the initial write command and prior to the write latency of the memory device, without damage to existing stored data.

4. The method of claim 3 wherein the command cancel signal terminates the write operation within the DRAM devices.

5. The method of claim 4 wherein the command cancel signal resets FIFO clocks.

6. The method of claim 3 wherein the command cancel signal is transmitted on a unique pin.

7. The method of claim 3 wherein the command cancel signal is triggered by ECC logic.

8. The method of claim 7 wherein the ECC logic operates in parallel or series mode.

9. The method of claim 8 wherein if an ECC error is detected in parallel mode a re-try operation is performed to determine if a soft error occurred allowing continuous ECC parallel operation.

10. The method of claim 9 wherein if an ECC error is detected which required correction, the ECC mode is changed to serial operation until a repair action is completed.

11. The method of claim 3 wherein the command cancel signal is triggered by a parity bit.

* * * * *